US012690239B2

(12) United States Patent
Shin

(10) Patent No.: US 12,690,239 B2
(45) Date of Patent: Jul. 21, 2026

(54) SEMICONDUCTOR DEVICE

(71) Applicant: DB HITEK CO., LTD., Seoul (KR)

(72) Inventor: Hong Sik Shin, Bucheon-si (KR)

(73) Assignee: DB HITEK CO., LTD., Seoul (KR)

( * ) Notice: Subject to any disclaimer, the term of this patent is extended or adjusted under 35 U.S.C. 154(b) by 481 days.

(21) Appl. No.: 18/201,697

(22) Filed: May 24, 2023

(65) Prior Publication Data

US 2024/0234585 A1 Jul. 11, 2024

(30) Foreign Application Priority Data

Jan. 10, 2023 (KR) ........................ 10-2023-0003728

(51) Int. Cl.
*H10D 30/83* (2025.01)
*H10D 62/10* (2025.01)
*H10D 62/13* (2025.01)
*H10D 62/17* (2025.01)

(52) U.S. Cl.
CPC ........... *H10D 30/83* (2025.01); *H10D 62/116* (2025.01); *H10D 62/149* (2025.01); *H10D 62/343* (2025.01); *H10D 62/357* (2025.01)

(58) Field of Classification Search
CPC .... H10D 30/83; H10D 62/116; H10D 62/149; H10D 62/343; H10D 62/357; H10D 62/126; H10D 30/051; H10D 62/328
See application file for complete search history.

(56) References Cited

U.S. PATENT DOCUMENTS

2012/0126406 A1* 5/2012 Dix ..................... H10W 20/484
257/E23.033

* cited by examiner

*Primary Examiner* — Mohammad A Rahman
(74) *Attorney, Agent, or Firm* — Husch Blackwell

(57) ABSTRACT

A semiconductor device includes a channel region formed on a substrate, a source region formed on the channel region, a drain region formed on the channel region, a gate region formed on the channel region between the source region and the drain region, a source contact region formed on a portion of the source region, and a resistance region formed on another portion of the source region. The source contact region and the resistance region are electrically connected in parallel with a source terminal.

18 Claims, 5 Drawing Sheets

SEMICONDUCTOR DEVICE

CROSS-REFERENCE TO RELATED APPLICATION

This application claims the priority benefit of Korean Patent Application No. 10-2023-0003728, filed on Jan. 10, 2023, and all the benefits accruing therefrom under 35 U.S.C. § 119, the contents of which are incorporated by reference in their entirety.

TECHNICAL FIELD

The present disclosure relates to a semiconductor device. More specifically, the present disclosure relates to a semiconductor device such as a junction field effect transistor (JFET) formed on a substrate.

BACKGROUND

A semiconductor device such as a JFET may be used to control the current. For example, the semiconductor device may include a channel region formed on a substrate, a source region and a drain region formed on the channel region, and a gate region formed on the channel region between the source region and the drain region.

The substrate and the gate region may have a different conductivity type than the channel region, and the source region and the drain region may have the same conductivity type as the channel region. When a drain voltage higher than a source voltage is applied to the drain region, a current may flow through the channel region. In such case, the magnitude of the current may be controlled by a gate voltage applied to the gate region. In particular, when the drain voltage is increased, a depletion layer may be extended between the gate region and the substrate. Further, after the gate voltage reaches a pinch-off voltage, the current may be maintained substantially constant even if the drain voltage is increased. However, when the drain voltage becomes higher than a breakdown voltage, the semiconductor device may be damaged.

SUMMARY

The present disclosure provides a semiconductor device capable of increasing the breakdown voltage.

In accordance with an aspect of the present disclosure, a semiconductor device may include a channel region formed on a substrate, a source region formed on the channel region, a drain region formed on the channel region, a gate region formed on the channel region between the source region and the drain region, and a source contact region formed on a portion of the source region. In such case, the source region and the source contact region may be electrically connected in parallel with a source terminal.

In accordance with another aspect of the present disclosure, a semiconductor device may include a channel region formed on a substrate, a source region formed on the channel region, a drain region formed on the channel region, a gate region formed on the channel region between the source region and the drain region, a source contact region formed on a portion of the source region, and a resistance region formed on another portion of the source region. In such case, the source contact region and the resistance region may be electrically connected in parallel with a source terminal.

In accordance with some embodiments of the present disclosure, the source contact region and the resistance region may have the same conductivity type as the source region, the source contact region may have an impurity concentration higher than that of the source region, and the resistance region may have an impurity concentration equal to or lower than that of the source region.

In accordance with some embodiments of the present disclosure, the source contact region may have the same conductivity type as the source region, and the resistance region may have a conductivity type different from that of the source region.

In accordance with some embodiments of the present disclosure, the semiconductor device may further include a gate contact region formed on the gate region. In such case, the gate region and the gate contact region may have the same conductivity type as the resistance region, and the resistance region may have the same impurity concentration as the gate contact region.

In accordance with still another aspect of the present disclosure, a semiconductor device may include a channel region formed on a substrate, a drain region formed on the channel region, a gate region formed on the channel region to surround the drain region, a source region formed on the channel region to surround the gate region, at least one source contact region formed on the source region, and at least one resistance region formed on the source region. In such case, the at least one source contact region and the at least one resistance region may be electrically connected in parallel with a source terminal.

In accordance with some embodiments of the present disclosure, the substrate may have a first conductivity type, and the channel region and the source region may have a second conductivity type. Further, the at least one source contact region may have the second conductivity type and may have an impurity concentration higher than that of the source region, and the at least one resistance region may have the second conductivity type and may have an impurity concentration equal to or lower than that of the source region.

In accordance with some embodiments of the present disclosure, the substrate has a first conductivity type, and the channel region and the source region have a second conductivity type. Further, the at least one source contact region may have the second conductivity type, and the at least one resistance region may have the first conductivity type. In such case, the semiconductor device may further include a gate contact region formed on the gate region, the gate region and the gate contact region may have the first conductivity type, and the at least one resistance region may have the same impurity concentration as the gate contact region.

In accordance with some embodiments of the present disclosure, a plurality of source contact regions may be formed on the source region at regular intervals, and a plurality of resistance regions may be formed on the source region among the plurality of source contact regions.

In accordance with some embodiments of the present disclosure, the semiconductor device may further include a device isolation region formed to surround the source region.

In accordance with some embodiments of the present disclosure, the substrate may have a first conductivity type, the channel region may be a second conductivity type, and the device isolation region may have the first conductivity type and may be electrically connected to the substrate.

In accordance with some embodiments of the present disclosure, the semiconductor device may further include a gate contact region formed on the gate region, the gate region and the gate contact region may have the first conductivity type, and the gate contact region and the device isolation region may be electrically connected to a gate terminal.

In accordance with some embodiments of the present disclosure, the semiconductor device may further include a drain contact region formed on the drain region, a gate contact region formed on the gate region, and a field oxide layer formed between the drain contact region and the gate contact region.

In accordance with some embodiments of the present disclosure, the semiconductor device may further include a drift region formed between the channel region and the field oxide layer, connected to the gate region, and having a same conductivity type as the gate region.

In accordance with some embodiments of the present disclosure, the drift region may be spaced apart from the drain region by a predetermined interval.

In accordance with some embodiments of the present disclosure, the semiconductor device may further include a first electrode layer formed on the field oxide layer to be adjacent to the drain contact region, and a second electrode layer formed on the field oxide layer to be adjacent to the gate contact region. In such case, the drain contact region and the first electrode layer may be electrically connected to a drain terminal, and the gate contact region and the second electrode layer may be electrically connected to a gate terminal.

In accordance with some embodiments of the present disclosure, the first electrode layer and the second electrode layer may be made of impurity-doped polysilicon.

In accordance with some embodiments of the present disclosure, the semiconductor device may further include a plurality of well regions formed between the substrate and the gate region and having the same conductivity type as the gate region.

In accordance with some embodiments of the present disclosure, the gate region may have a circular ring shape surrounding the drain region, and the plurality of well regions may each have a circular ring shape, and may be arranged in a concentric circle shape and spaced apart from the substrate by a predetermined interval.

In accordance with the embodiments of the present disclosure as described above, the source contact region and the resistance region may be electrically connected in parallel between the source region and the source terminal, and the breakdown voltage of the semiconductor device may be increased by the resistance region.

The above summary of the present disclosure is not intended to describe each illustrated embodiment or every implementation of the present disclosure. The detailed description and claims that follow more particularly exemplify these embodiments.

BRIEF DESCRIPTION OF THE DRAWINGS

Embodiments can be understood in more detail from the following description taken in conjunction with the accompanying drawings, in which.

Figure 1:
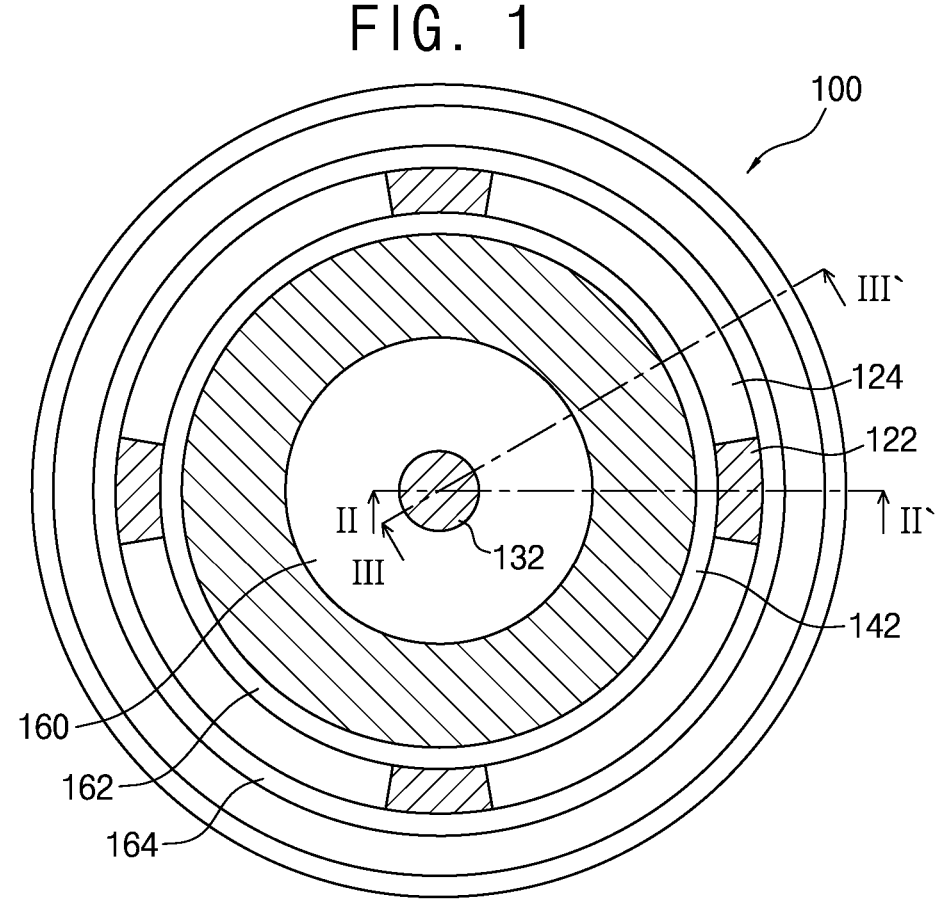
FIG. 1 is a schematic plan view illustrating a semiconductor device in accordance with an embodiment of the present disclosure.

While various embodiments are amenable to various modifications and alternative forms, specifics thereof have been shown by way of example in the drawings and will be described in detail. It should be understood, however, that the intention is not to limit the claimed inventions to the particular embodiments described. On the contrary, the intention is to cover all modifications, equivalents, and alternatives falling within the spirit and scope of the subject matter as defined by the claims.

DETAILED DESCRIPTION

Hereinafter, embodiments of the present disclosure are described in more detail with reference to the accompanying drawings. However, the present disclosure is not limited to the embodiments described below and is implemented in various other forms. Embodiments below are not provided to fully complete the present disclosure but rather are provided to fully convey the range of the present disclosure to those skilled in the art.

In the specification, when one component is referred to as being on or connected to another component or layer, it can be directly on or connected to the other component or layer, or an intervening component or layer may also be present. Unlike this, it will be understood that when one component is referred to as directly being on or directly connected to another component or layer, it means that no intervening component is present. Also, though terms like a first, a second, and a third are used to describe various regions and layers in various embodiments of the present disclosure, the regions and the layers are not limited to these terms.

Terminologies used below are used to merely describe specific embodiments, but do not limit the present disclosure. Additionally, unless otherwise defined here, all the terms including technical or scientific terms, may have the same meaning that is generally understood by those skilled in the art.

Embodiments of the present disclosure are described with reference to schematic drawings of ideal embodiments. Accordingly, changes in manufacturing methods and/or allowable errors may be expected from the forms of the drawings. Accordingly, embodiments of the present disclosure are not described being limited to the specific forms or areas in the drawings, and include the deviations of the forms. The areas may be entirely schematic, and their forms may not describe or depict accurate forms or structures in any given area, and are not intended to limit the scope of the present disclosure.

Figure 2:
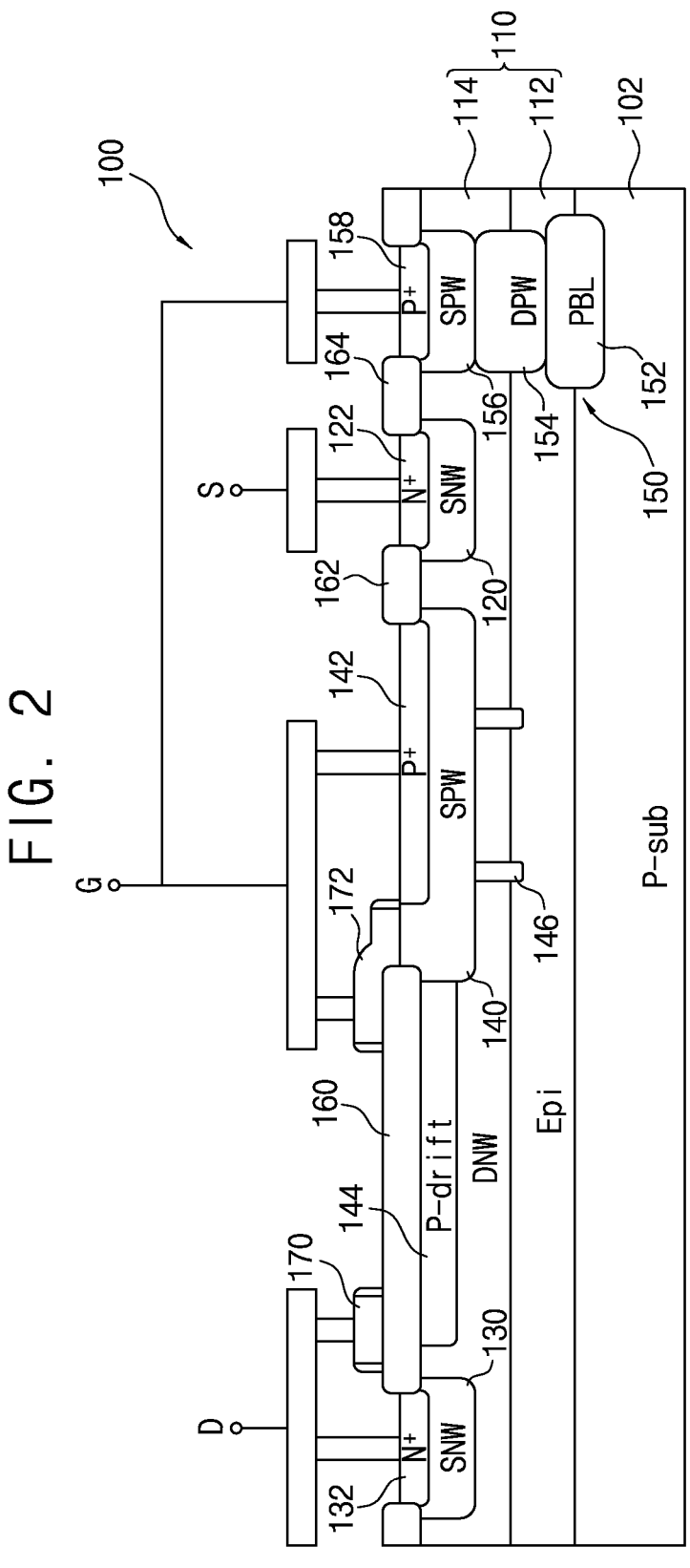
FIG. 2 is a schematic cross-sectional view taken along line II-II' shown in FIG. 1 to illustrate a source contact region shown in FIG. 1.

FIG. 1 is a schematic plan view illustrating a semiconductor device in accordance with an embodiment of the present disclosure. FIG. 2 is a schematic cross-sectional view taken along line II-II' shown in FIG. 1 to illustrate a source contact region shown in FIG. 1, and FIG. 3 is a schematic cross-sectional view taken along line III-III' shown in FIG. 1 to illustrate a resistance region shown in FIG. 1.

Figure 3:
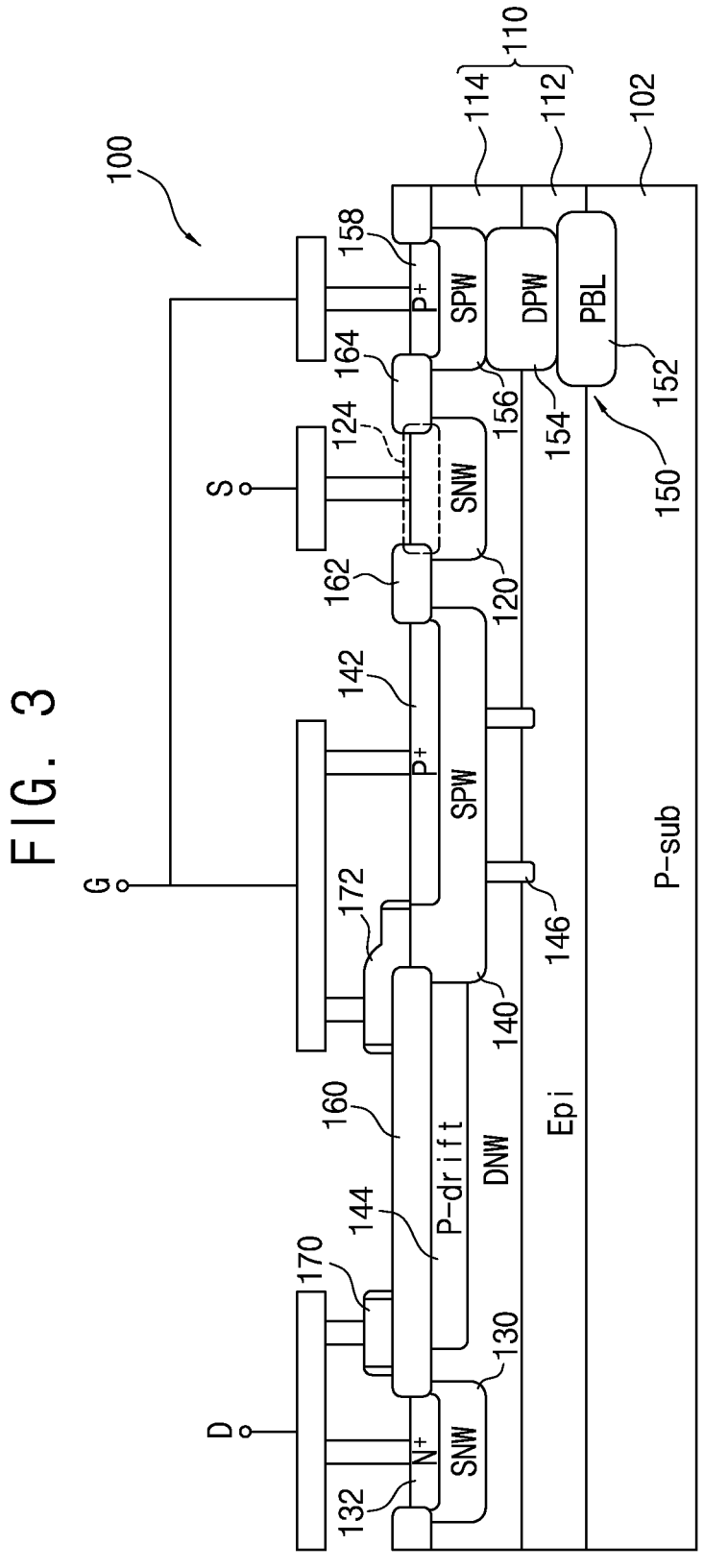
FIG. 3 is a schematic cross-sectional view taken along line III-III' shown in FIG. 1 to illustrate a resistance region shown in FIG. 1.

Referring to FIGS. 1 to 3, a semiconductor device 100, in accordance with an embodiment of the present disclosure, may be used as a JFET, and may include a channel region 110 formed on a substrate 102, a source region 120 formed on the channel region 110, a drain region 130 formed on the channel region 110, and a gate region 140 formed on the channel region 110 between the source region 120 and the drain region 130.

The substrate 102 may have a first conductivity type, and the channel region 110 may have a second conductivity type different from the first conductivity type. For example, a P-type silicon wafer may be used as the substrate 102, and the channel region 110 may include a deep N-type well (DNW) region 114 formed on the substrate 102. The DNW region 114 may be formed through an ion implantation process. The channel region 110 may further include an epitaxial region 112 formed on the substrate 102. In such case, the DNW region 114 may be formed on the epitaxial region 112. For example, the epitaxial region 112 may have the second conductivity type, and an N-type epitaxial region 112 may be formed on the substrate 102.

Each of the source region 120 and the drain region 130 may include a shallow N-type well (SNW) region formed on the channel region 110. The SNW region may be formed through an ion implantation process. A source contact region 122 and a drain contact region 132 may be formed on the source region 120 and the drain region 130, respectively. Each of the source contact region 122 and the drain contact region 132 may be a high-concentration N-type impurity region having an impurity concentration higher than that of the SNW region, and may be formed through an ion implantation process.

The gate region 140 may include a shallow P-type well (SPW) region formed on the channel region 110. The SPW region may be formed through an ion implantation process. A gate contact region 142 may be formed on the gate region 140. The gate contact region 142 may be a high-concentration P-type impurity region having an impurity concentration higher than that of the SPW region, and may be formed through an ion implantation process.

In accordance with an embodiment of the present disclosure, the gate region 140 may have a circular ring shape surrounding the drain region 130, and the gate contact region 142 may be formed on the gate region 140 to have a circular ring shape. The source region 120 may have a circular ring shape surrounding the gate region 140, and the source contact region 122 may be formed on a portion of the source region 120. For example, as shown in FIGS. 1 and 2, a plurality of source contact regions 122 may be formed on the source region 120 at regular intervals.

The semiconductor device 100 may include a device isolation region 150 formed to surround the source region 120. For example, the device isolation region 150 may have a circular ring shape surrounding the source region 120, and may include a P-type buried layer (PBL) 152 formed in the substrate 102, a deep P-type well (DPW) region 154 formed on the PBL 152, an SPW region 156 formed on the DPW region 154, and a well contact region 158 formed on the SPW region 156. In particular, the PBL 152 may be connected to the P-type substrate 102.

Field oxide layers 160, 162, and 164 may be formed between the drain region 130 and the gate region 140, between the gate region 140 and the source region 120, and between the source region 120 and the device isolation region 150, respectively. For example, a first field oxide layer 160 having a circular ring shape may be formed between the drain contact region 132 and the gate contact region 142, a second field oxide layer 162 having a circular ring shape may be formed between the gate contact region 142 and the source contact region 122, and a third field oxide layer 164 having a circular ring shape may be formed between the source contact region 122 and the well contact region 158. The field oxide layers 160, 162, and 164 may be formed through a thermal oxidation process.

A P-type drift region 144 may be formed between the channel region 110 and the first field oxide layer 160, and a plurality of second DPW regions 146 may be formed between the substrate 102 and the gate region 140. For example, the P-type drift region 144 may have a circular ring shape and extend laterally from an inner side of the gate region 140 toward the drain region 130. The second DPW regions 146 may each have a circular ring shape, may be arranged in a concentric circle shape, and may extend downward from the gate region 140 toward the substrate 102. In addition, the P-type drift region 144 may be spaced apart from the drain region 130 by a predetermined interval, and the second DPW regions 146 may be spaced apart from the substrate 102 by a predetermined interval. As shown in FIGS. 2 and 3, although two second DPW regions 146 are used, the number of the second DPW regions 146 may be changed. Therefore, the scope of the present disclosure may not be limited by the number of the second DPW regions 146.

The source region 120 and the drain region 130 may be electrically connected to a source terminal S and a drain terminal D through contact plugs and metal wires, respectively, and the gate region 140 may be connected to a gate terminal G through contact plugs and metal wires. Particularly, the device isolation region 150 may be electrically connected to the gate terminal G through contact plugs and metal wires, and accordingly, the same gate voltage may be applied to the gate region 140 and the substrate 102.

When a source voltage is applied to the source region 120 and a drain voltage higher than the source voltage is applied to the drain region 130, a current may flow from the drain region 130 to the source region 120 through the channel region 110. At this time, a reverse voltage may be applied between the drain region 130 and the gate region 140, and a depletion layer may be formed between the gate region 140 and the substrate 102. In particular, as the drain voltage 130 increases, the depletion layer may be expanded. Further, when the channel region 110 is closed by the depletion layer, the current may be substantially constant even if the drain voltage is increased. In such case, the current may be controlled by adjusting the gate voltage applied to the gate region 140 and the substrate 102.

A first electrode layer 170 may be formed on the first field oxide layer 160 to be adjacent to the drain contact region 132, and a second electrode layer 172 may be formed on the first field oxide layer 160 and the gate region 140 to be adjacent to the gate contact region 142. The first electrode layer 170 may be electrically connected to the drain terminal D, and the second electrode layer 172 may be electrically connected to the gate terminal G. The first electrode layer 170 and the second electrode layer 172 may be used to uniformly form the depletion layer between the gate region 140 and the substrate 102. For example, the first electrode layer 170 and the second electrode layer 172 may be formed of impurity-doped polysilicon.

In accordance with an embodiment of the present disclosure, as shown in FIGS. 2 and 3, the source region 120 and the source contact region 122 may be electrically connected in parallel with the source terminal S. For example, a plurality of source contact regions 122 may be formed on the source region 120, and upper portions 124 of the source region 120 among the source contact regions 122 may function as resistance regions. In such case, the source terminal S may be connected to the source contact regions 122 and the upper portions 124 of the source region 120 through contact plugs. The upper portions 124 of the source region 120 may provide relatively greater electrical resistance compared to the source contact regions 122. That is, the source contact regions 120 and the resistance regions 124 may be connected in parallel between the source region 120 and the source terminal S, and a breakdown voltage of the semiconductor device 100 may be increased by the resistance regions 124.

Figure 4:
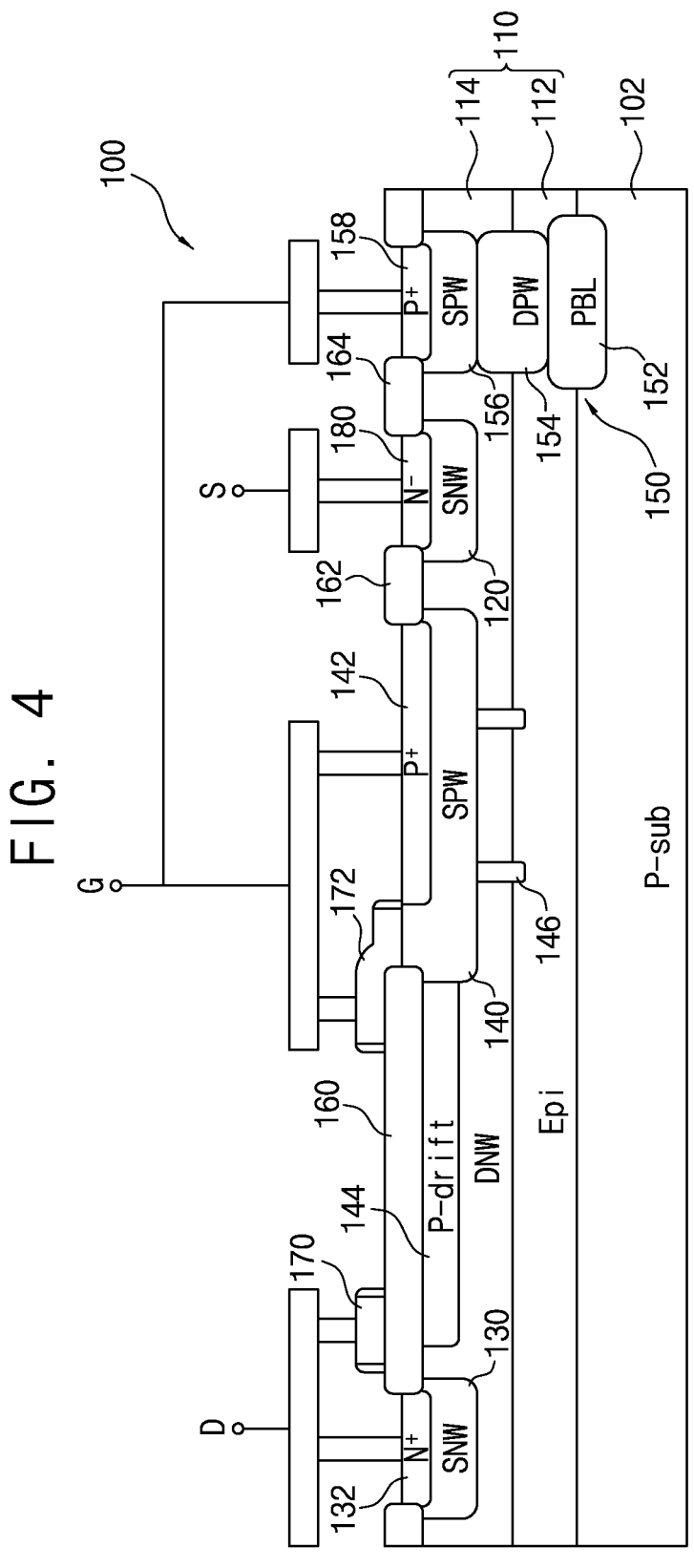
FIGS. 4 and 5 are schematic cross-sectional views illustrating other examples of the resistance regions shown in FIG. 3.
Figure 5:
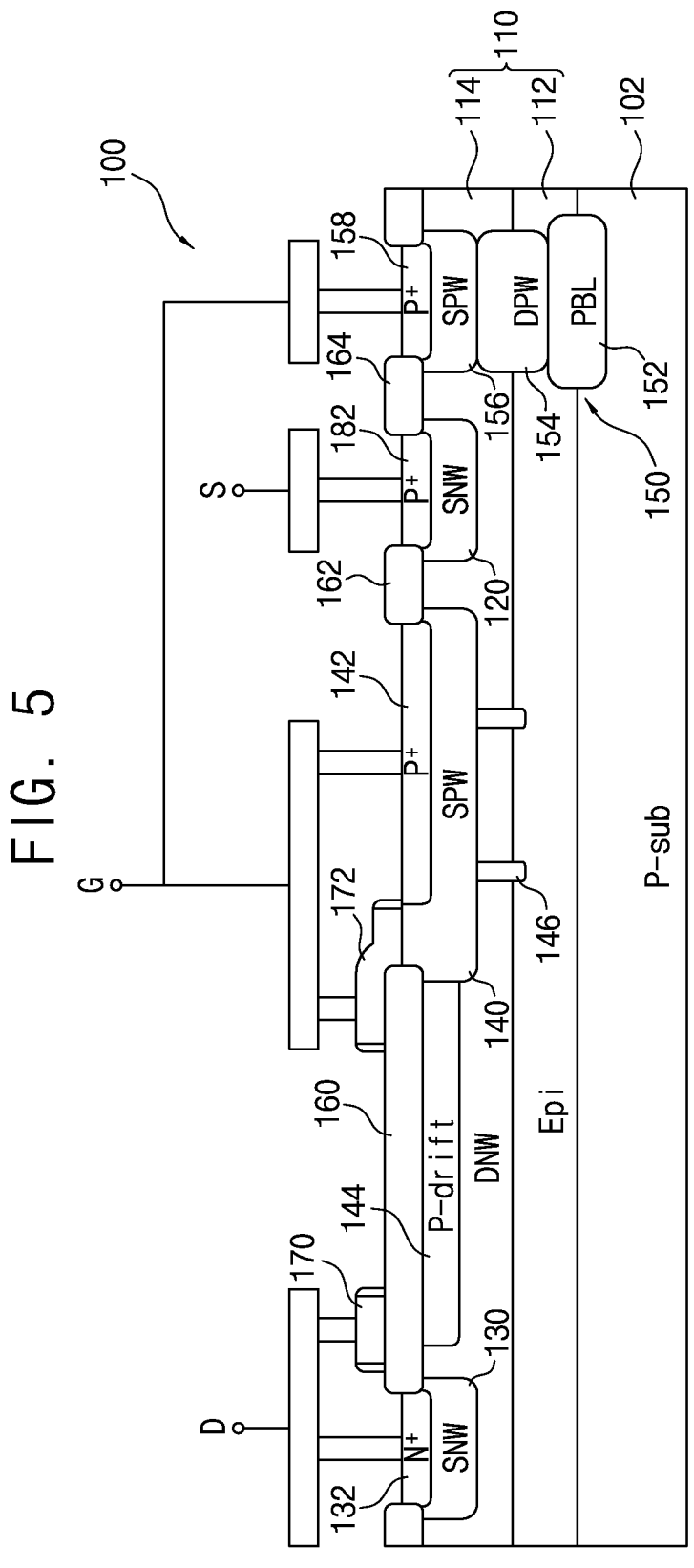

FIGS. 4 and 5 are schematic cross-sectional views illustrating other examples of the resistance regions shown in FIG. 3.

Referring to FIG. 4, the semiconductor device 100 may include a source contact region 122 formed on a portion of the source region 120 and a resistance region 180 formed on another portion of the source region 120. For example, a plurality of source contact regions 122 may be formed at regular intervals on the source region 120, and resistance regions 180 may be formed on the source region 120 among the source contact regions 122. The resistance regions 180 may be N-type impurity diffusion regions and may be formed through an ion implantation process. In particular, the resistance regions 180 may have an impurity concentration lower than the source region 120, and thus, electrical resistance between the source region 120 and the source terminal S may be provided by the resistance regions 180.

Referring to FIG. 5, the semiconductor device 100 may include a source contact region 122 formed on a portion of the source region 120 and a resistance region 182 formed on another portion of the source region 120. For example, a plurality of source contact regions 122 may be formed at regular intervals on the source region 120, and resistance regions 182 may be formed on the source region 120 among the source contact regions 122. The resistance regions 182 may be P-type impurity diffusion regions. For example, the resistance regions 182 may be formed simultaneously with the gate contact region 142 by an ion implantation process and may have the same impurity concentration as the gate contact region 142. In such case, depletion layers may be formed between the source region 120 and the resistance regions 182, and thus, electrical resistance between the source region 120 and the source terminal S may be provided by the depletion layers.

In accordance with the embodiments of the present disclosure as described above, the source contact regions 122 and the resistance regions 124, 180 or 182 may be electrically connected in parallel between the source region 120 and the source terminal S, and the breakdown voltage of the semiconductor device 100 may be increased by the resistance regions 124, 180 or 182.

Although the example embodiments of the present disclosure have been described with reference to the specific embodiments, they are not limited thereto. Therefore, it will be readily understood by those skilled in the art that various modifications and changes can be made thereto without departing from the spirit and scope of the present disclosure defined by the appended claims.

The invention claimed is:

1. A semiconductor device comprising:
a channel region formed on a substrate;
a source region formed on the channel region;
a drain region formed on the channel region;
a gate region formed on the channel region between the source region and the drain region; and
a source contact region formed on a portion of the source region, wherein the source region and the source contact region are electrically connected in parallel with a source terminal and
wherein the source contact region has an impurity concentration higher than that of the source region.

2. A semiconductor device comprising:
a channel region formed on a substrate;
a source region formed on the channel region;
a drain region formed on the channel region;
a gate region formed on the channel region between the source region and the drain region;
a source contact region formed on a portion of the source region; and
a resistance region formed on another portion of the source region,
wherein the source contact region and the resistance region are electrically connected in parallel with a source terminal,
wherein the source contact region and the resistance region have a same conductivity type as the source region,
the source contact region has an impurity concentration higher than that of the source region, and
the resistance region has an impurity concentration equal to or lower than that of the source region.

3. A semiconductor device comprising:
a channel region formed on a substrate;
a source region formed on the channel region;
a drain region formed on the channel region;
a gate region formed on the channel region between the source region and the drain region;
a source contact region formed on a portion of the source region; and
a resistance region formed on another portion of the source region,
wherein the source contact region and the resistance region are electrically connected in parallel with a source terminal,
wherein the source contact region has a same conductivity type as the source region, and
the resistance region has a conductivity type different from that of the source region.

4. The semiconductor device of claim 3, further comprising a gate contact region formed on the gate region,
wherein the gate region and the gate contact region have a same conductivity type as the resistance region, and
the resistance region has a same impurity concentration as the gate contact region.

5. A semiconductor device comprising:
a channel region formed on a substrate;
a drain region formed on the channel region;
a gate region formed on the channel region to surround the drain region;
a source region formed on the channel region to surround the gate region;
at least one source contact region formed on the source region;
at least one resistance region formed on the source region; and
a device isolation region formed to surround the source region,
wherein the at least one source contact region and the at least one resistance region are electrically connected in parallel with a source terminal.

6. The semiconductor device of claim 5, wherein the substrate has a first conductivity type, the channel region and the source region have a second conductivity type, the at least one source contact region has the second conductivity type and has an impurity concentration higher than that of the source region, and the at least one resistance region has the second conductivity type and has an impurity concentration equal to or lower than that of the source region.

7. The semiconductor device of claim 5, wherein the substrate has a first conductivity type, the channel region and the source region have a second conductivity type, the at least one source contact region has the second conductivity type, and the at least one resistance region has the first conductivity type.

8. The semiconductor device of claim 7, further comprising a gate contact region formed on the gate region, wherein the gate region and the gate contact region have the first conductivity type, and the at least one resistance region has a same impurity concentration as the gate contact region.

9. The semiconductor device of claim 5, wherein a plurality of source contact regions is formed on the source region at regular intervals, and a plurality of resistance regions is formed on the source region among the plurality of source contact regions.

10. The semiconductor device of claim 5, wherein the substrate has a first conductivity type, the channel region has a second conductivity type, and the device isolation region has the first conductivity type and is electrically connected to the substrate.

11. The semiconductor device of claim 10, further comprising a gate contact region formed on the gate region, wherein the gate region and the gate contact region have the first conductivity type, and the gate contact region and the device isolation region are electrically connected to a gate terminal.

12. The semiconductor device of claim 5, further comprising:

a drain contact region formed on the drain region;

a gate contact region formed on the gate region; and a field oxide layer formed between the drain contact region and the gate contact region.

13. The semiconductor device of claim 12, further comprising a drift region formed between the channel region and the field oxide layer, connected to the gate region, and having a same conductivity type as the gate region.

14. The semiconductor device of claim 13, wherein the drift region is spaced apart from the drain region by a predetermined interval.

15. The semiconductor device of claim 13, further comprising:

a first electrode layer formed on the field oxide layer to be adjacent to the drain contact region; and a second electrode layer formed on the field oxide layer to be adjacent to the gate contact region, wherein the drain contact region and the first electrode layer are electrically connected to a drain terminal, and the gate contact region and the second electrode layer are electrically connected to a gate terminal.

16. The semiconductor device of claim 15, wherein the first electrode layer and the second electrode layer are made of impurity-doped polysilicon.

17. The semiconductor device of claim 5, further comprising a plurality of well regions formed between the substrate and the gate region and having a same conductivity type as the gate region.

18. The semiconductor device of claim 17, wherein the gate region has a circular ring shape surrounding the drain region, and the plurality of well regions each has a circular ring shape, and is arranged in a concentric circle shape and spaced apart from the substrate by a predetermined interval.

* * * * *